United States Patent
Han et al.

(10) Patent No.: US 10,886,175 B2
(45) Date of Patent: Jan. 5, 2021

(54) DIFFERENTIATED MOLECULAR DOMAINS FOR SELECTIVE HARDMASK FABRICATION AND STRUCTURES RESULTING THEREFROM

(71) Applicant: Intel Corporation, Santa Clara, CA (US)

(72) Inventors: Eungnak Han, Portland, OR (US); Rami Hourani, Portland, OR (US); Florian Gstrein, Portland, OR (US); Gurpreet Singh, Hillsboro, OR (US); Scott B. Clendenning, Portland, OR (US); Kevin L. Lin, Beaverton, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 16/347,507

(22) PCT Filed: Dec. 23, 2016

(86) PCT No.: PCT/US2016/068582
§ 371 (c)(1),
(2) Date: May 3, 2019

(87) PCT Pub. No.: WO2018/118089
PCT Pub. Date: Jun. 28, 2018

(65) Prior Publication Data
US 2020/0058548 A1 Feb. 20, 2020

(51) Int. Cl.
*H01L 29/06* (2006.01)
*H01L 21/768* (2006.01)
(Continued)

(52) U.S. Cl.
CPC .... *H01L 21/76897* (2013.01); *H01L 21/0337* (2013.01); *H01L 21/31144* (2013.01);
(Continued)

(58) Field of Classification Search
CPC ........... H01L 21/76877; H01L 29/4966; H01L 21/76816; H01L 21/76805; H01L 21/76832
(Continued)

(56) References Cited

U.S. PATENT DOCUMENTS 8,034,707 B2 10/2011 Ueda
8,324,094 B2 12/2012 Endo et al.
(Continued)

OTHER PUBLICATIONS

International Search Report and Written Opinion for International Patent Application No. PCT/US2016/068582 dated Aug. 31, 2017, 8 pgs.
(Continued)

*Primary Examiner* — S. V. Clark
(74) *Attorney, Agent, or Firm* — Schwabe, Williamson & Wyatt, P.C.

(57) ABSTRACT

Selective hardmask-based approaches for conductive via fabrication are described. In an example, an integrated circuit structure includes a plurality of conductive lines in an inter-layer dielectric (ILD) layer above a substrate. The plurality of conductive lines includes alternating non-recessed conductive lines and recessed conductive lines. The non-recessed conductive lines are substantially co-planar with the ILD layer, and the recessed conductive lines are recessed relative to an uppermost surface of the ILD layer. A dielectric capping layer is in recess regions above the recessed conductive lines. A hardmask layer is over the non-recessed conductive lines but not over the dielectric capping layer of the recessed conductive lines. The hardmask layer differs in composition from the dielectric cap-
(Continued)

ping layer. A conductive via is in an opening in the dielectric capping layer and on one of the recessed conductive lines. A portion of the conductive via is on a portion of the hardmask layer.

20 Claims, 10 Drawing Sheets

(51) Int. Cl.
    *H01L 21/033*     (2006.01)
    *H01L 21/311*     (2006.01)
    *H01L 23/522*     (2006.01)

(52) U.S. Cl.
    CPC .... *H01L 21/76831* (2013.01); *H01L 23/5226* (2013.01); *H01L 21/0332* (2013.01)

(58) Field of Classification Search
    USPC .................................. 257/750, 758; 438/622
    See application file for complete search history.

(56) References Cited

U.S. PATENT DOCUMENTS

| | | | |
|---|---|---|---|
| 2006/0205204 A1* | 9/2006 | Beck | H01L 21/76843 438/628 |
| 2010/0038623 A1* | 2/2010 | Xu | H01L 45/12 257/4 |
| 2011/0306206 A1* | 12/2011 | Kiehlbauch | H01L 21/0273 438/666 |
| 2015/0179515 A1* | 6/2015 | Jezewski | H01L 21/31144 257/774 |
| 2016/0148869 A1 | 5/2016 | Schenker et al. | |
| 2016/0163640 A1 | 6/2016 | Edelstein et al. | |

OTHER PUBLICATIONS

International Preliminary Report on Patentability for International Patent Application No. PCT/US2016/068582 dated Jul. 4, 2019, 7 pgs.

* cited by examiner

DIFFERENTIATED MOLECULAR DOMAINS FOR SELECTIVE HARDMASK FABRICATION AND STRUCTURES RESULTING THEREFROM

CROSS-REFERENCE TO RELATED APPLICATION

This patent application is a U.S. National Phase Application under 35 U.S.C. § 371 of International Application No. PCT/US2016/068582, filed Dec. 23, 2016, entitled "DIFFERENTIATED MOLECULAR DOMAINS FOR SELECTIVE HARDMASK FABRICATION AND STRUCTURES RESULTING THEREFROM," which designates the United States of America, the entire disclosure of which is hereby incorporated by reference in its entirety and for all purposes.

TECHNICAL FIELD

Embodiments of the disclosure are in the field of semiconductor structures and processing and, in particular, differentiated molecular domains for selective hardmask fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

DESCRIPTION OF THE EMBODIMENTS

Figure 1A:
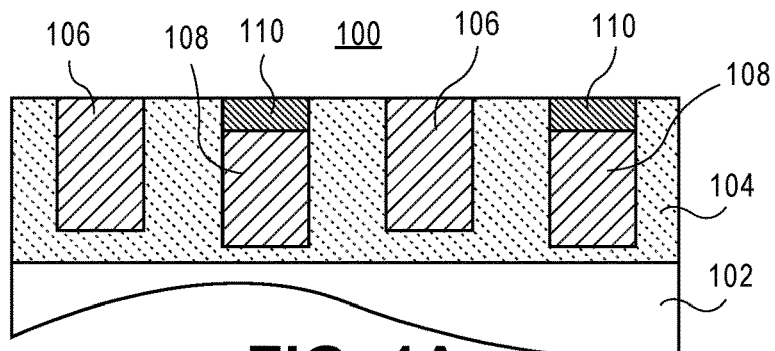
FIGS. 1A-1D illustrate cross-sectional views of portions of integrated circuit layers representing various operations in a method involving selective hardmask formation, in accordance with an embodiment of the present disclosure.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70-90 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly several different lithographic masks may be used, which tend to increase the costs. At some point, if pitches continue to decrease, it may not be possible, even with multiple masks, to print via openings for these extremely small pitches using EUV scanners.

Thus, improvements are needed in the area of back end metallization manufacturing technologies for fabricating metal vias.

Differentiated molecular domains for selective hardmask fabrication, and the resulting structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to selective hardmask approaches for conductive via fabrication, or other conductive structure fabrication. Selective hardmask fabrication may be achieved by directed self-assembly (DSA) or selective growth. Such selective hardmasks may be implemented in a processing scheme to enable the fabrication of self-aligned interconnects. Embodiments may address or implement one or more of the use of a differentiated molecular domain, a differentiated or "colored" hardmask, directed self-assembly, selective deposition, self-alignment, or patterning interconnects at tight pitch. Embodiments may be implemented to provide improved via shorting margin by self-alignment with "coloring" through selective deposition, and subsequent directed self-assembly, e.g., for the 10 nm and smaller technology nodes. In one embodiment, differentiated molecular domains are implemented for pattern-replication-based via self-alignment.

To provide context, current solutions to improve shorting margin may include recessing the metal or ILD to "steer" the via towards the line of interest. In accordance with an embodiment of the present disclosure, self-alignment strategies based on pattern replication of metal gratings are described. The integration of selective hardmasks into a pattern replication flow may provide for one or more of the following advantages: (1) Removal of the need for a conventional etch stop layer: pattern replication may be incompatible with conventional etch stop layers, as etch stop layers render the surface non-selective to subsequent pattern replication; instead, selective hardmasks may be implemented to retain the desired selectivity of the surface and function as an etch stop layer and an electromigration cap, (2) Improved selectivity outcomes: pattern replication by DSA or self-assembled monolayer (SAM) based selective deposition may be more facile on some metals versus others; selective hardmasks may be implemented to enable pattern replication on metals which otherwise are incompatible with such replication techniques, (3) Facile integration of "color" materials: color materials may be dielectric hardmasks, which enable self-alignment, however, the deposition and cure of such color materials is typically not compatible with some common interconnect metals, for instance Co or Cu, which are prone to oxidation, plasma damage etc.; selective hardmasks formed in a manner that avoids damage oxidation caused by conventional hardmask deposition.

To provide further context, local interconnect and tight-pitch metal layers may require the use of self-aligned vias. Patterning and aligning features at tighter pitch may require many reticles and critical alignment strategies that can be extremely expensive for a semiconductor manufacturing process. Surface modification methods may be implemented to enable pattern replication using directed self-assembly (DSA) of block copolymer materials. Pattern replicated DSA structures can be used as a template to put different ("colored") hardmasks over adjacent metal lines. In this way shorting margin can be improved. In accordance with one or more embodiments described herein, polymeric brush layers are used instead of a block copolymer for pattern replication without pitch limitation. In particular embodiments, a brush layer is implemented as an active placeholder for permanent hardmask material without the use of a DSA operation. Such an approach may simplify the integration operations of the process scheme and can be applied to multi-pitch gratings. Embodiments may be implemented to provide a self-aligned hardmask without the use of lithography operation.

Selective surface modification may be performed and a brush layer may be transformed to a hardmask layer to provide a selective hardmask. As an example, FIGS. 1A-1D illustrate cross-sectional views of portions of integrated circuit layers representing various operations in a method involving selective hardmask formation, in accordance with an embodiment of the present disclosure.

Referring to FIG. 1A, a starting structure 100 includes a plurality of alternating conductive features 106 and 108, such as alternating conductive lines, formed in an interlayer-dielectric (ILD) layer formed above a substrate 102. The conductive features 106 of the plurality of alternating conductive features 106 and 108 have an exposed surface of a conductive material, such as a conductive fill material or a conductive cap. The conductive features 108 of the plurality of alternating conductive features 106 and 108 have a capping layer 110, such as a dielectric capping layer. In one embodiment, the surface chemistry of the capping layer 110 is more similar, or the same as, the ILD layer 104 versus the surface chemistry of the exposed surface of the conductive material of the conductive features 106 of the plurality of the alternating conductive features 106 and 108. In an embodiment, the plurality of alternating conductive features 106 and 108 is a single pitch grating. In another embodiment, the plurality of alternating conductive features 106 and 108 is a multi-pitch grating.

Figure 1B:
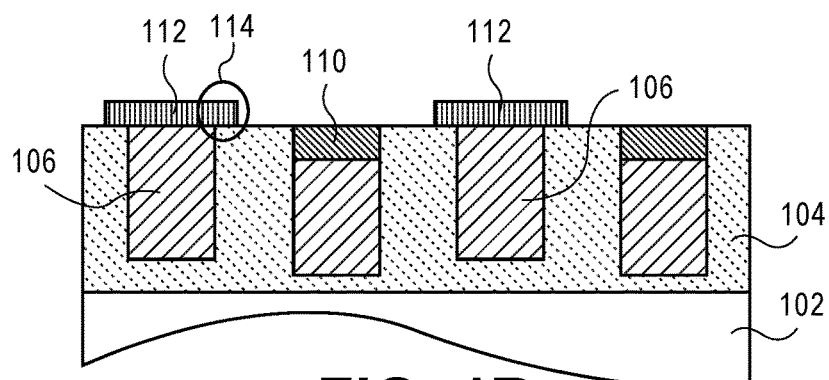

Referring to FIG. 1B, a first brush layer 112 is formed on the surface of the starting structure 100 of FIG. 1A. In an embodiment, the first brush layer 112 is selectively grafted over the exposed (metal-containing) surface of the conductive material of the conductive features 106 plurality of the alternating conductive features 106 and 108, as is depicted. In one embodiment, the first brush layer includes poly (methyl methacrylate) (PMMA). In another embodiment, layer 112 of FIG. 1B is formed by a directed self-assembly (DSA) or selective growth process, in place of or in combination with a chemical brush process.

It is to be appreciated that although the brush layer 112 can be applied selective to the exposed surface of the conductive material of the conductive features 106, the alignment may not be perfect, and extension portions 114 of the first brush layer 112 may be formed over portions of the ILD layer 104, as is depicted in the embodiment shown in FIG. 1B. In an embodiment alternative to that depicted in FIG. 1B, a first brush layer is selectively grafted over the capping layer 110 of the conductive features 108 of the plurality of the alternating conductive features 106 and 108 and, possibly, over the surfaces of the ILD layer 104, leaving the surfaces of the conductive material of the conductive features 106 as exposed. In an embodiment, once the brush layer 112 is implemented, over a specific location (e.g., either metal or ILD surface locations), brush layer 112 is used as a scaffold for a hardmask precursor.

Figure 1C:
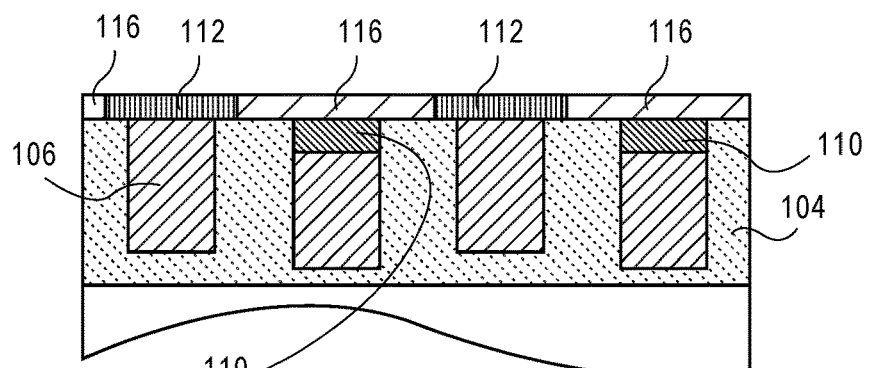

Referring to FIG. 1C, optionally, a second brush layer 116 is formed on the surface of the structure of FIG. 1B. In an embodiment, the second brush layer 112 is selectively grafted over the exposed capping layer 110 of the conductive features 108 of the plurality of the alternating conductive features 106 and 108, and over the surfaces of the ILD layer 104. In one embodiment, the second brush layer includes polystyrene (PS). In another embodiment, as an alternative to PS, a polymeric brush is used that does not contain functional groups that interact with the precursors such as alcohol, ester, ether, carbonyl, carboxyl, amine, nitrile, thiol, pyridyl, or imine functionality.

In another embodiment, layer 116 of FIG. 1C is formed by a directed self-assembly (DSA) or selective growth process, in place of or in combination with a chemical brush process. In an embodiment, second brush layer 116 is grafted on the other surface to enhance the precursor selectivity at locations of the first brush layer 112. In an embodiment, self-assembled monolayer (SAMs) of long alkane chains (e.g., 1-22 carbons) are used.

In the case that a second brush is implemented, in an alternative embodiment, the first brush 112 and the second brush 116 are formed in a same processing operation. In one such embodiment, a direct self-assembly (DSA) block co-polymer deposition and polymer assembly process is performed. For example, a DSA block co-polymer may be coated on the surface and annealed to segregate the polymer into first blocks and second blocks. In one such embodiment, the first polymer blocks preferentially attach to the exposed surfaces of the ILD layer 104 and to the expose capping layer 110. The second polymer blocks adhere to the conductive features 106.

In one such embodiment, the block copolymer molecule is a polymeric molecule formed of a chain of covalently bonded monomers. In a di-block copolymer, there are two different types of monomers, and these different types of monomers are primarily included within two different blocks or contiguous sequences of monomers. In an embodiment, the block of a first polymer includes predominantly a chain of covalently linked monomer A (e.g., A-A-A-A-A . . . ), whereas the block of a second polymer includes predominantly a chain of covalently linked monomer B (e.g., B-B-B-B-B . . . ). The monomers A and B may represent any of the different types of monomers used in block copolymers known in the art. By way of example, the monomer A may represent monomers to form polystyrene, and the monomer B may represent monomers to form poly(methyl methacrylate) (PMMA), or vice versa, although the scope of the disclosure is not so limited. In other embodiments, there may be more than two blocks. Moreover, in other embodiments, each of the blocks may include different types of monomers (e.g., each block may itself be a copolymer). In one embodiment, the block of first polymer and the block of second polymer are covalently bonded together. The block of first polymer and the block of second polymer may be of approximately equal length, or one block may be significantly longer than the other.

Typically, the blocks of block copolymers (e.g., the block of first polymer and the block of second polymer) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

Figure 1D:
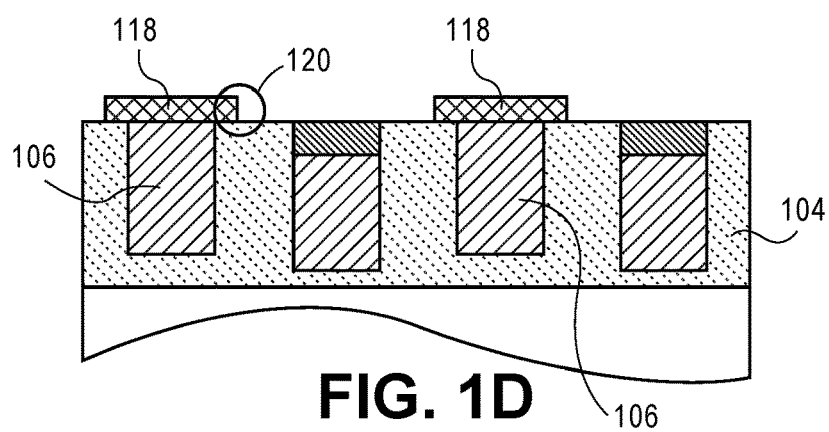

Referring to FIG. 1D, the first brush layer 112 is converted to a hardmask layer 118. In an embodiment, the hardmask layer 118 has an etch characteristic different from etch characteristics of ILD layer 104 and capping layer 110. As described below in association with FIGS. 3A-3F, such a differential etch characteristic may be exploited to fabricate a self-aligned conductive via structure. It is to be appreciated that in the case that the brush layer 112 is applied without perfect alignment, extension portions 120 of the hardmask layer 118 may be formed over portions of the ILD layer 104, as is depicted in the embodiment shown in FIG. 1D.

Referring again to FIG. 1D, in the case that a second brush layer 116 was formed as described in association with FIG. 1C, in an embodiment, such a brush layer 116 is removed subsequent to converting the first brush layer 112 to the hardmask layer 118.

A process may be implemented to effect metal selective surface modification and formation of a brush layer, precursor infiltration, ashing of the brush layer, and ultimate fabrication of hardmask. As an example, FIGS. 2A-2C illustrate cross-sectional views of portions of a conductive feature representing various operations in a method involving selective hardmask formation, in accordance with an embodiment of the present disclosure.

Figure 2A:
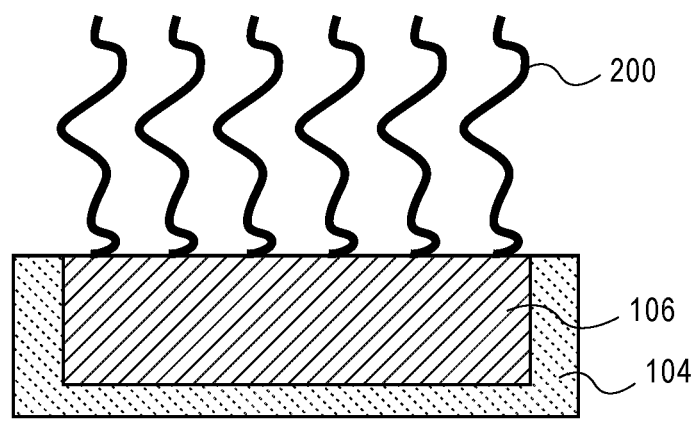
FIGS. 2A-2C illustrate cross-sectional views of portions of a conductive feature representing various operations in a method involving selective hardmask formation, in accordance with an embodiment of the present disclosure.

Referring to FIG. 2A, a conductive structure 106 is provided in an ILD layer 104, which may be formed above a substrate, as was described in association with FIG. 1A. A molecular layer 200, such as layer 112 (which may be a brush layer) described above in association with FIG. 1B, is formed on the surface of the conductive structure 106.

In an embodiment, the molecular layer is formed on the surface of the conductive structure 106 by selective grafting, DSA (such as spin-on DSA), or selective growth. In one embodiment, the molecular layer 200 is porous or has low density in the sense that pores or spacings are formed throughout the molecular layer 200. In a specific embodiment, the pores or spacing account for, e.g., 40-60% of the volume of the molecular layer 200. In another specific embodiment, the pores or spacing account for, e.g., greater than 50% of the volume of the molecular layer 200.

Figure 2B:
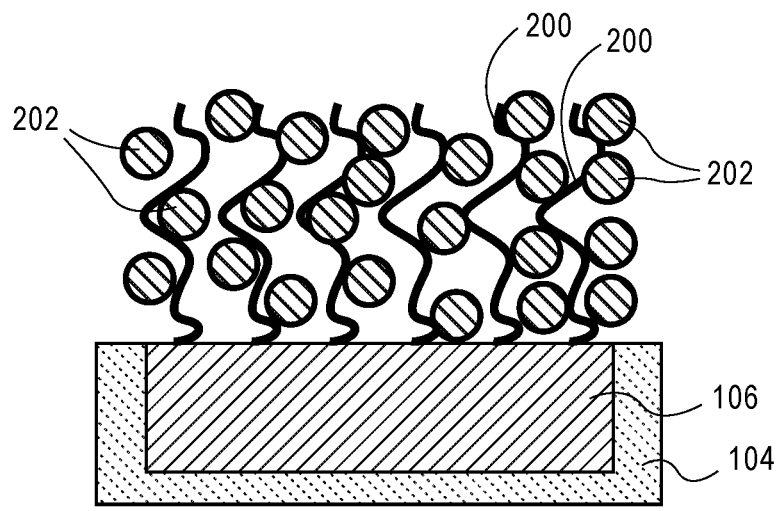
Figure 2C:
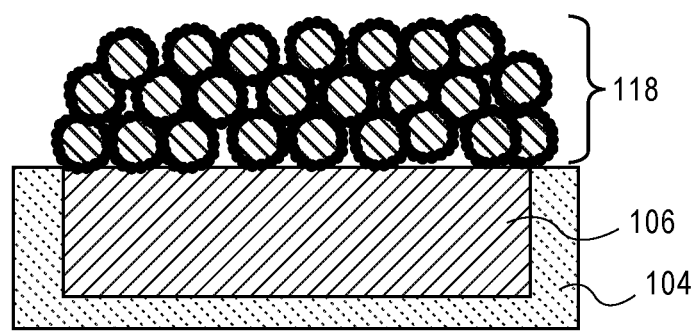

Referring to FIG. 2B, the pores or spacings of the molecular layer 200 are filled with hardmask precursors 202. In an embodiment, the process of filling the pores or spacings of the molecular layer 200 with hardmask precursors 202 is referred to as precursor infiltration of molecular layer 200. In one embodiment, molecules of the hardmask precursors 202 are delivered to the molecular layer 200 in the vapor phase. In another embodiment, molecules of the hardmask precursors 202 are delivered to the molecular layer 200 in the liquid phase.

In a particular embodiment, the pores or spacings of the molecular layer 200 are filled with hardmask precursors 202 using an atomic layer deposition (ALD) process. In one such embodiment, a slow and penetrating ALD process is used to fill the pores or spacings of the molecular layer 200. In other embodiments, the pores or spacings of the molecular layer 200 are filled with hardmask precursors 202 filled using a spin-on process. In either case, in an embodiment, by using the above described two-operation process of brush or DSA or selective growth of molecular layer 200 followed by pore or spacing filling, chemical stability of the resulting filled material may be achieved.

In an embodiment, the pores or spacings of the molecular layer 200 are filled with a metal-containing material. In one such embodiment, the metal-containing material is a metal nitride or a precursor to a metal nitride such as, but not limited to, titanium nitride (TiN), vanadium nitride (VN) or tantalum nitride (TaN). In another such embodiment, the metal-containing material is a metal oxide or a precursor to a metal oxide such as, but not limited to, scandium oxide ($Sc_2O_3$), yttrium oxide ($Y_2O_3$), tantalum oxide ($Ta_2O_5$), titanium oxide ($TiO_2$), zirconium oxide ($ZrO_2$), aluminum oxide ($Al_2O_3$), or hafnium oxide ($HfO_2$). In other embodiments, a non-metal-containing material or a precursor to a non-metal-containing material, such as boron carbide, boron nitride, silicon nitride, silicon oxide, silicon dioxide or silicon carbide, is used to fill the pores or spacings of the molecular layer 200.

In a particular example, a PMMA brush layer is grafted on a metal surface. The PMMA brush layer can adsorb trimethyl aluminum (TMA) which can converted to an alumina oxide hardmask in the ash operations. It is to be appreciated that other types of polymeric materials that have alcohol, ester, ether, carbonyl, carboxyl, amine, nitrile, thiol, pyridyl, or imine functionality that can interact with hard mask precursor are used. For example, a material such as, but not limited to, P4VP, 2VP, Poly(4-vinylphenol) etc. can be used as a brush layer for inclusion of various precursor molecules in a similar manner.

Referring to FIG. 2C, the structure of FIG. 2B including the molecular layer 200 having pores or spacings filled with hardmask precursors 202 is converted to a hardmask layer 118, such as hardmask layer 118 described in association with FIG. 1D. In an embodiment, the hardmask layer 118 has an etch characteristic different from etch characteristics of ILD layer 104. In an embodiment, the hardmask layer 118 has a stability suitable to protect the conductive feature 106 during a subsequent etch process. As described below in association with FIGS. 3A-3F, such a differential etch characteristic or material stability characteristic may be exploited to fabricate a self-aligned conductive via structure.

In an embodiment, the molecular layer 200 having pores or spacings filled with hardmask precursors 202 is converted to the hardmask layer 118 using an ash process. In one embodiment, the ash process removes all or substantially all of the polymer and/or carbon-based material of molecular layer 220 to essentially remove most, if not all, of the material of molecular layer 200. In a specific embodiment, the ashing and, hence, removal of the molecular layer 200 permits the hardmask precursors 202 to be converted to the material of hardmask layer 118. In another specific embodiment, the ashing and, hence, removal of the molecular layer 200 permits the hardmask precursors 202 to coagulate, forming hardmask layer 118.

In an embodiment, the ash process is a plasma ash process. In an embodiment, the operations of FIGS. 2A, 2B and 2C are performed once and in sequence to form hardmask 118. In another embodiment, the operations of FIGS. 2A, 2B and 2C are cyclically repeated to form hardmask 118 to a selected thickness. In another embodiment, the operations of FIGS. 2B and 2C are cyclically repeated to form hardmask 118 to a selected thickness.

In an embodiment, a metal nitride or a precursor is used to fill the pores or spacings of molecular layer 200, and to provide a metal nitride hardmask such as, but not limited to, titanium nitride (TiN), vanadium nitride (VN) or tantalum nitride (TaN) hardmask upon ashing the molecular layer 200. In another such embodiment, a metal oxide or a precursor is used to fill the pores or spacings of molecular layer 200, and to provide a metal oxide hardmask such as, but not limited to, scandium oxide ($Sc_2O_3$), yttrium oxide ($Y_2O_3$), tantalum oxide ($Ta_2O_5$), titanium oxide ($TiO_2$), zirconium oxide ($ZrO_2$), aluminum oxide ($Al_2O_3$), or hafnium oxide ($HfO_2$) hardmask upon ashing the molecular layer 200. In another embodiment, a ruthenium oxide (RuO) is formed by such an approach.

In a particular example, a PMMA brush layer is grafted on a metal surface. The PMMA brush layer can adsorb trimethyl aluminum (TMA) which can converted to an alumina oxide hardmask in the ash operations. It is to be appreciated that other types of polymeric materials such as, but not limited to, P4VP, 2VP, Poly(4-vinylphenol) etc. can be used as a brush layer for inclusion of various precursor molecules in a similar manner.

More generally, one or more embodiments are directed to an approach for fabricating metal lines as well as associated conductive vias. Conductive vias or vias, by definition, are used to land on a previous layer metal pattern. In this vein, embodiments described herein enable a more robust interconnect fabrication scheme since constraints on lithography equipment are relaxed. Such an interconnect fabrication scheme can be used to save numerous alignment/exposures, and can be used to reduce total process operations and processing time otherwise required for patterning such features using conventional approaches. Other benefits may include improvements in yield, or the prevention of shorting to a wrong line.

In an exemplary approach for forming a conductive via, FIGS. 3A-3F illustrate cross-sectional views of portions of integrated circuit layers representing various operations in a method involving selective hardmask and self-aligned conductive via formation for back end of line (BEOL) interconnect fabrication, in accordance with an embodiment of the present disclosure.

Figure 3A:
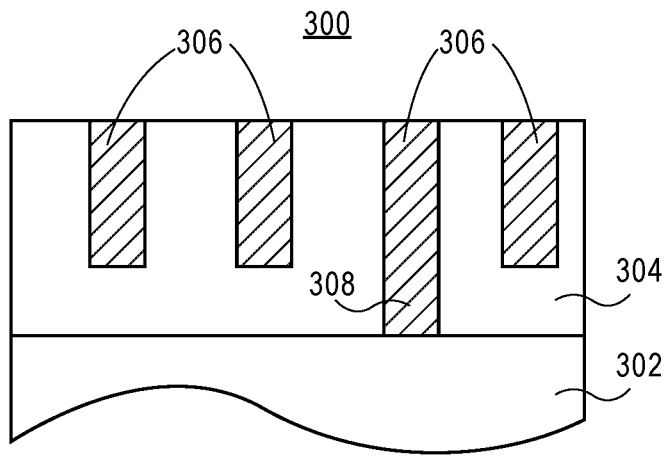
FIGS. 3A-3F illustrate cross-sectional views of portions of integrated circuit layers representing various operations in a method involving selective hardmask and self-aligned conductive via formation for back end of line (BEOL) interconnect fabrication, in accordance with an embodiment of the present disclosure.

Referring to FIG. 3A, a starting structure 300 is provided as a beginning point for fabricating a new metallization layer. The starting structure 300 includes an inter-layer dielectric (ILD) layer 304 disposed above a substrate 302. As described below, the ILD layer 304 may be disposed above an underlying metallization layer formed above the substrate 102. Trenches are formed in the ILD layer 104 and are filled with a conductive layer or layers to provide conductive lines 306 (and, in some cases, corresponding conductive vias 308). In an embodiment, the trenches of conductive lines 306 are formed in the ILD layer 304 using a pitch division patterning process flow. Non-limiting examples of such pitch division schemes are described in greater detail below in association with FIGS. 5A, 5B and 6. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment. In an embodiment, the plurality of conductive lines 306 is a single pitch grating. In another embodiment, the plurality of conductive lines 306 is a multi-pitch grating.

In an embodiment, the conductive lines 306 are all fabricated at the same time and are fabricated from the same material or materials. In another embodiment, however, the starting structure 300 is fabricated by patterning a hardmask and ILD layer and then metallizing half of a population of metal trenches (e.g., alternating one of the trenches), leaving the other half of the population open until a subsequent metallization process is performed on the other half of the population. Such an approach allows for the possibility of differing composition of alternating lines. For example, in one embodiment, a metallization layer ultimately includes conductive interconnects of alternating, differing first and second compositions.

Figure 3B:
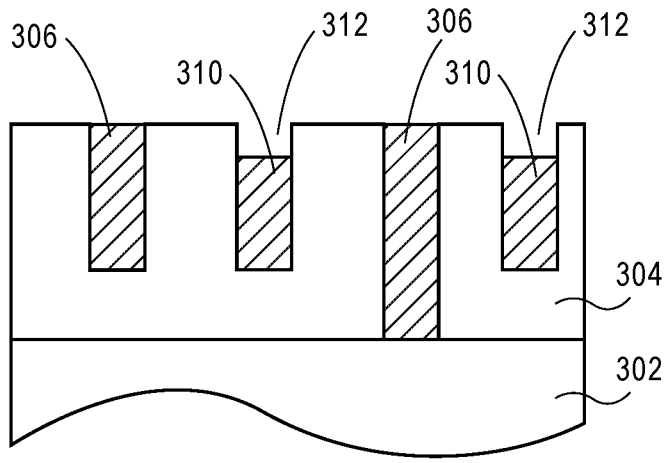

Referring to FIG. 3B, alternative ones of the plurality of conductive lines 306 are recessed below the upper surface of the ILD layer 304 to provide recessed conductive lines 310 having recess regions 312 above the recessed conductive lines 310. In an embodiment, then, at this stage, remaining ones of non-recessed conductive lines 306 alternate with recessed conductive lines 310. In an embodiment, alternating ones of the conductive lines 306 are recessed to form the recessed conductive lines 310 using a selective wet etch process, such as a wet etch process based on sulfuric acid and hydrogen peroxide. In another embodiment, alternating ones of the conductive lines 306 are recessed to form recessed conductive lines 310 using a selective dry or plasma etch process.

In an embodiment, the non-recessed conductive lines 306 and the recessed conductive lines 310 have a same total composition, and the recessed conductive lines 310 are formed by masking regions where the non-recessed conductive lines 306 are to remain and etching the unmasked regions to form the recessed conductive lines 310. In another embodiment, the non-recessed conductive lines 306 and the recessed conductive lines 310 have a different total composition, and the recessed conductive lines 310 are formed by masking regions where the non-recessed conductive lines 306 are to remain and etching the unmasked regions to form the recessed conductive lines 310. In another embodiment, the non-recessed conductive lines 306 and the recessed conductive lines 310 have a different total composition, and the recessed conductive lines 310 are formed by using an etch that only etches the material of the recessed conductive lines 310.

Figure 3C:
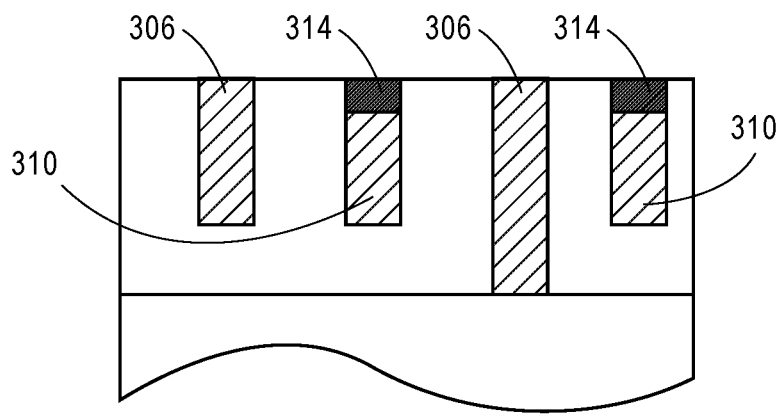

Referring to FIG. 3C, a capping layer 314 is formed in the recess regions 312 above the recessed conductive lines 310. In an embodiment, the capping layer 314 is composed of a material that has more similar surface characteristics compared with the surface of ILD layer 304 than does the material of the conductive lines 306. In an embodiment, the conductive lines 306 include a copper fill material within a titanium nitride or tantalum nitride barrier liner, and the capping layer 314 is composed of a dielectric material such as a silicon oxide, silicon nitride, a silicon carbide material, or a non-conductive metal oxide layer such as a high-k dielectric layer. In an embodiment, the capping layer 314 is formed using a chemical vapor deposition (CVD) process or an atomic layer deposition (ALD) process, or a spin-on process. In any case, in an embodiment, following deposition, the material of the capping layer 314 is planarized, e.g., using chemical mechanical polishing (CMP), resulting in capping layer 314 that is substantially co-planar with an uppermost surface of the ILD layer 304, as is depicted in FIG. 3C. In an embodiment, the capping layer 314 includes a material such as, but not limited to, silicon oxide, carbon-doped silicon, silicon nitride, or silicon oxynitride.

It is to be appreciated that, aside from protecting the metal of recessed conductive lines 310 in subsequent processing steps, the material of capping layer 314 may also aid the selective deposition of brush materials, such as in the processes described above in association with FIGS. 1A-1D and 2A-2C. In an embodiment, capping layer 314 provides hermeticity during processing and reliability benefits in lieu of a conventional etch stop layer, in addition to facilitating pattern replication.

Figure 3D:
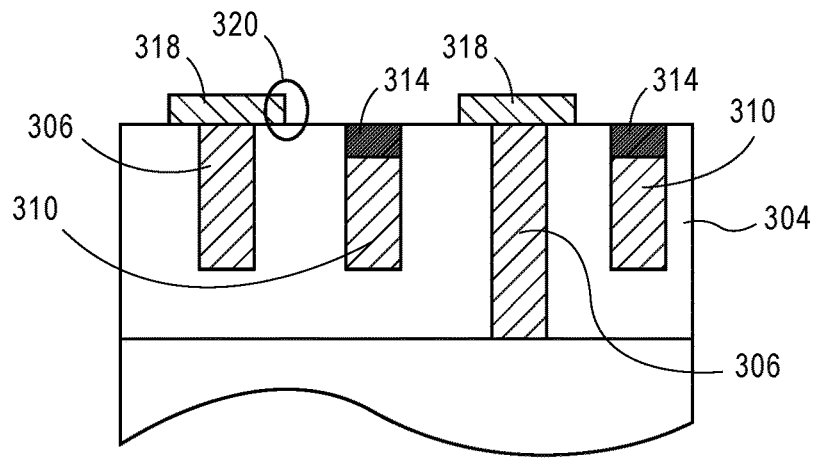

Referring to FIG. 3D, a hardmask layer 318 is formed over the structure of FIG. 3C. The hardmask layer 318 is, in an embodiment, formed on and in alignment with the first conductive lines 306. In a particular embodiment, however, the alignment is not perfect, and extension portions 320 are included in hardmask layer 318. The extension portions 318 cover a portion of surface of the ILD layer 304. In an embodiment, the hardmask layer 316 is formed using an approach and is composed of a material as described above in embodiments regarding hardmask layer 118.

In an embodiment, the hardmask layer 318 has an etch characteristic different from the etch characteristics of the ILD layer 304 and of the capping layer 314. In a particular embodiment, the hardmask layer 318 is composed of alumina, and the capping dielectric is selected from the group consisting of silicon oxide, carbon-doped silicon, silicon nitride, and silicon oxynitride.

As described in greater detail below, in an embodiment, the resulting structure of FIG. 3D enables improved via shorting margins when fabricating later via layers on the structure of FIG. 3D. In one embodiment, improved shorting margin is achieved since fabricating a structure with a selective hardmask reduces the risk of a via shorting to a wrong metal line. In one embodiment, self-alignment is achieved since the selective hardmask is self-aligned to the conducive lines 306.

Figure 3E:
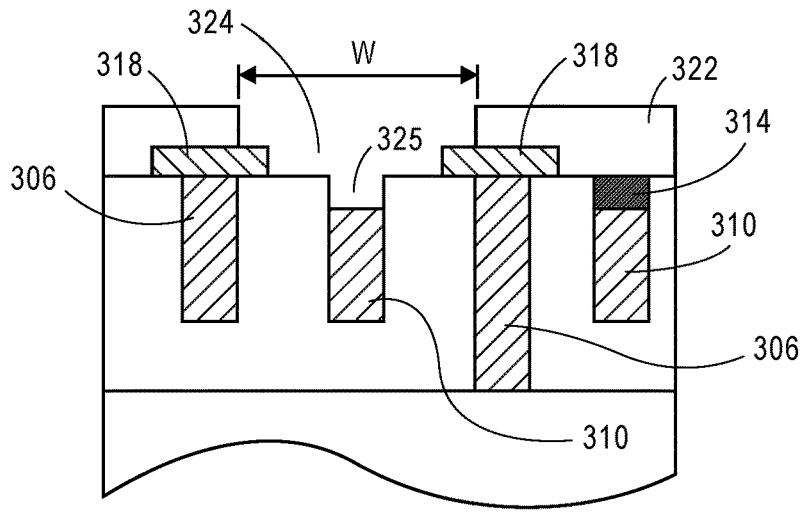

Referring to FIG. 3E, a second inter-layer dielectric (ILD) layer 322 is formed above the structure of FIG. 3D. An opening 324 is formed in the second ILD layer 322. In an embodiment, the opening 324 is formed in a location selected for conductive via fabrication for a next level metallization layer. In contrast to conventional via location selection, the opening 324 can, in one embodiment, have a relatively relaxed width (W) as compared to the width of the corresponding conductive line (such as a selected conductive line 310) onto which the conductive via will ultimately be formed. Such an accommodation for a relatively wider via opening 324 can relax constraints on the lithography process used to form the opening 324. Additionally, tolerance for mis-alignment may be increased as well.

In an embodiment, the capping layer 314 on the selected recessed conductive line 310 is removed in order to form an opening 325 exposing a conductive surface of the recessed conductive line 310. In one such embodiment, even in the case that portions of the hardmask layer 318 are exposed by the opening 324, etch characteristics of the capping layer 314 are different enough from the etch characteristics of the hardmask 318 such that hardmask 318 does not erode or only negligibly erodes during formation of the opening 324 and/or removal of the capping layer 314 from the selected recessed line 310 to form opening 325. In a particular embodiment, hardmask layer 318 protects conductive lines 306 and/or inhibits exposure of conductive lines 306 during the formation of the opening 324 and/or removal of the capping layer 314 from the selected recessed line 310 to form opening 325. In an embodiment, removal of the capping layer 314 from the selected recessed line 310 to form opening 325 is performed using a selective wet etch process. In another embodiment, removal of the capping layer 314 from the selected recessed line 310 to form opening 325 is performed using a selective dry or plasma etch process.

Figure 3F:
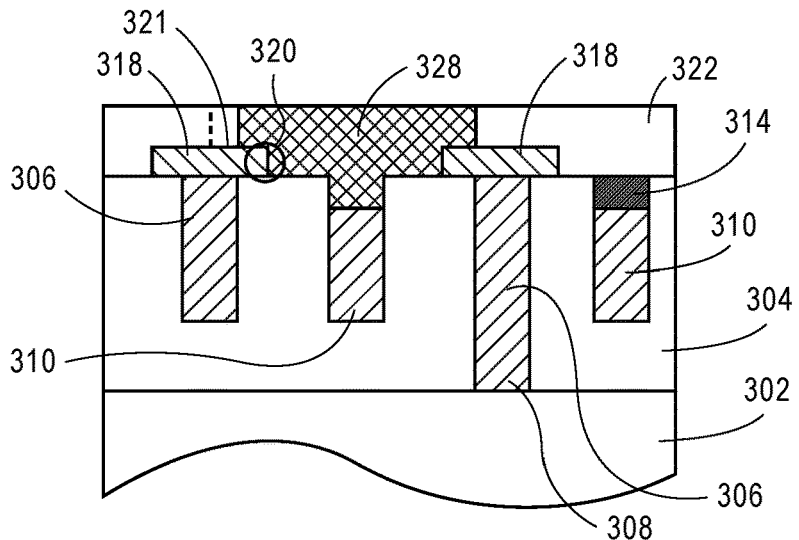

FIG. 3F illustrates the structure of FIG. 3E following next layer via fabrication. A conductive via 328 is formed in the opening 324 and in the opening 325, such that conductive via 328 is electrically connected to the selected recessed conductive line 310. In an embodiment, the conductive via 328 electrically contacts the selected recessed conductive line 310 without shorting to one of the adjacent or neighboring conductive lines 306. In a specific embodiment, a portion of the conductive via 328 is disposed on one or more exposed portions of the hardmask layer 318, as is depicted in FIG. 3F. In one such embodiment, the hardmask layer 318 inhibits electrical connection of conductive via 328 to adjacent or neighboring conductive lines 306. In an embodiment, then, an improved shorting margin is realized.

Referring again to FIG. 3F, in a first exemplary illustrative embodiment, an integrated circuit structure includes a plurality of conductive lines 306/310 in an inter-layer dielectric (ILD) layer 304 above a substrate 302. The plurality of conductive lines 306/310 includes alternating non-recessed conductive lines 306 and recessed conductive lines 310. The non-recessed conductive lines 306 are substantially co-planar with the ILD layer 304, and the recessed conductive lines 310 are recessed relative to an uppermost surface of the ILD layer 304. A dielectric capping layer 314 is in recess regions above the recessed conductive lines 310. A hardmask layer 318 is over the non-recessed conductive lines 306 but not over the dielectric capping layer 314 of the recessed conductive lines 310. The hardmask layer 318 differs in composition from the dielectric capping layer 314. A conductive via 328 is in an opening (325) in the dielectric capping layer 314 and on one of the recessed conductive lines 310. A portion of the conductive via 328 is on a portion of the hardmask layer 318.

In an embodiment, the conductive via 328 is over a portion 321 of the hardmask layer 318 over one of the non-recessed conductive lines 306 adjacent to the one of the recessed conductive lines 310, as is depicted in FIG. 3F, where the dashed line represents an extension of the conductive via 328 over the portion 321 of the hardmask layer 318. In an embodiment, the hardmask layer 318 includes an extension portion 320 over a portion of the ILD layer 304 between one of the non-recessed conductive lines 306 and the one of the recessed conductive lines 310, as is depicted in FIG. 3F. In one such embodiment, the conductive via 328 is over the extension portion 320 of the hardmask layer 318 over the portion of the ILD layer 304, as is depicted in FIG. 3F. In a particular such embodiment, the conductive via 328 is further over a portion 321 of the hardmask layer 318 over the one of the non-recessed conductive lines 306, as is depicted in FIG. 3F, where the dashed line represents an extension of the conductive via 328 over the portion 321 of the hardmask layer 318.

In an embodiment, the dielectric capping 314 layer has an uppermost surface substantially co-planar with the uppermost surface of the ILD layer 304, as is depicted in FIG. 3F. In an embodiment, a second ILD layer 322 is includes above the hardmask layer, and the conductive via 328 is further in an opening of the second ILD layer 322, as is depicted in FIG. 3F. In one such embodiment, the opening (324) of the second ILD layer 322 has a width greater than a width of the opening (325) in the dielectric capping layer 314, as is depicted in FIG. 3F. In an embodiment, one of the plurality of conductive lines 306/310 is coupled to an underlying conductive via structure 308, as is depicted in FIG. 3F. In one such embodiment, the underlying conductive via 308 structure is connected to an underlying metallization layer (not shown) of the integrated circuit structure.

In an embodiment, the hardmask layer 318 includes aluminum oxide, and the dielectric capping layer 314 includes a material selected from the group consisting of boron carbide, boron nitride, silicon oxide, carbon-doped silicon, silicon nitride and silicon oxynitride. In an embodiment, a total composition of the non-recessed conductive lines 306 is different than a total composition of the recessed conductive lines 310. In another embodiment, a total composition of the non-recessed conductive lines 306 is the same as a total composition of the recessed conductive lines 310.

Referring again to FIG. 3F, in a second exemplary illustrative embodiment, an integrated circuit structure includes a plurality of conductive lines 306/310 in an inter-layer dielectric (ILD) layer 304 above a substrate 302. A hardmask layer 318 is only over alternating ones (306) of the plurality of conductive lines 306/310. The hardmask layer 318 has openings over remaining ones 310 of the plurality of conductive lines 306/310. A conductive via 328 is in one of the openings over one of the remaining ones 310 of the plurality of conductive lines 306/310. A portion of the conductive via 328 is on a portion 321 of the hardmask layer 318 over one of the alternating ones 306 of the plurality of conductive lines 306/310 adjacent to the one of the remaining ones 310 of the plurality of conductive lines 306/310, as is depicted in FIG. 3F, where the dashed line represents an extension of the conductive via 328 over the portion 321 of the hardmask layer 318.

In an embodiment, the hardmask layer 318 includes an extension portion 320 over a portion of the ILD layer 304 between the one of the alternating ones 306 of the plurality of conductive lines 306/310 and the one of the remaining ones 310 of the plurality of conductive lines 306/310, as is depicted in FIG. 3F. The conductive via 328 is over the extension portion 320 of the hardmask layer 328 over the portion of the ILD layer 304. In an embodiment, a second ILD layer 322 is included above the hardmask layer 318. The conductive via 328 is further in an opening of the second ILD layer 322, as is depicted in FIG. 3F. In an embodiment, one of the plurality of conductive lines 306/310 is coupled to an underlying conductive via structure 308, as is depicted in FIG. 3F. In one such embodiment, the underlying conductive via structure is connected to an underlying metallization layer (not shown) of the integrated circuit structure.

A resulting structure such as described in association with FIG. 3F may subsequently be used as a foundation for forming subsequent metal line/via and ILD layers. Alternatively, the structure of FIG. 3F may represent the final metal interconnect layer in an integrated circuit. It is to be appreciated that the above process operations may be practiced in alternative sequences, not every operation need be performed and/or additional process operations may be performed. Although the above methods (e.g., FIG. 1A-1D, 2A-2C, or 3A-3F) of fabricating a metallization layer of a BEOL metallization layer have been described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

Figure 4:
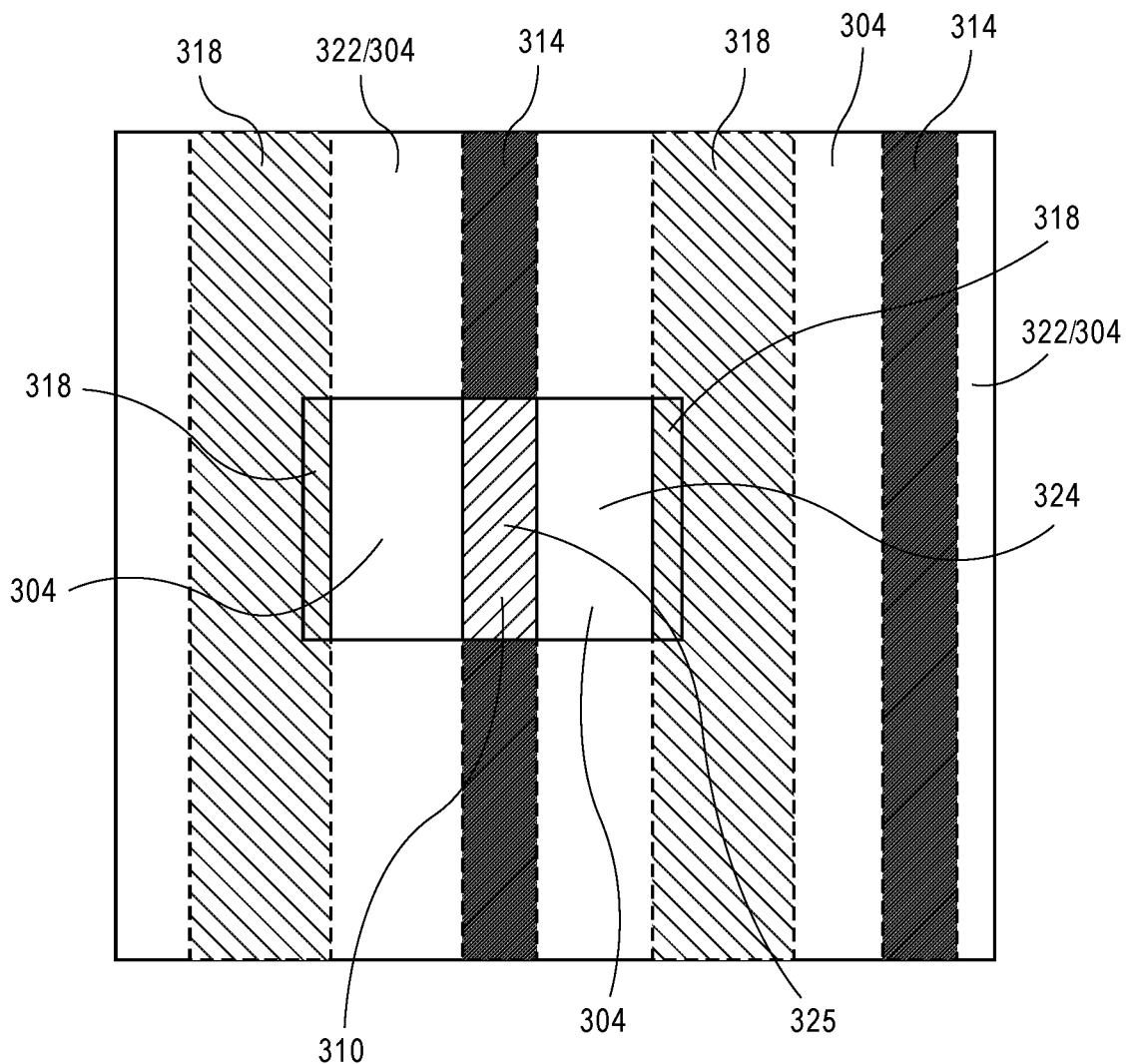
FIG. 4 illustrates a plan view of a portion of an integrated circuit layer representing an operation in a method involving selective hardmask and self-aligned conductive via formation for back end of line (BEOL) interconnect fabrication, in accordance with an embodiment of the present disclosure.

FIG. 4 illustrates a plan view of a portion of an integrated circuit layer representing an operation in a method involving selective hardmask and self-aligned conductive via formation for back end of line (BEOL) interconnect fabrication, in accordance with an embodiment of the present disclosure.

Referring to FIG. 4, features below and covered by the second ILD layer 322 are shown as features with dashed perimeters. Features exposed by opening 324, from a plan perspective, are shown with solid perimeters. In FIG. 4, according to one embodiment, locations of the hardmask layer 318, the dielectric capping layer 314, the opening 324, the opening 325, and surfaces of the ILD layer 304 are depicted. As seen in this view, in accordance with one embodiment, the opening 324 and, hence, the opening 325, does not reveal the entire underlying recessed line 310, but rather only a portion of the line 310 where via formation is to occur. It is further to be appreciated that FIG. 4 is representative of an embodiment where the plurality of conductive lines 306/310 (e.g., from FIGS. 3A-3F) is formed along a same direction of a back end of line (BEOL) metallization layer.

Embodiments described above may be implemented to enable strong self-alignment and mitigation of edge placement issues that otherwise plague conventional patterning. Embodiments may be implemented to enable integration of DSA and/or selective deposition. Embodiments may be implemented to enable robust interconnect reliability and low via/contact resistance.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, metal lines, or simply interconnect.

In an embodiment, as is also used throughout the present description, unless otherwise specified, hardmask materials (and in some instances etch stop layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide or boron carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods.

It is to be appreciated that the layers and materials described in association with FIGS. 1A-1D, 2A-2C, 3A-3F and 4 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 3F (i.e., as starting from FIG. 3A) may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc. In other embodiments, the pitch does not need to be constant, nor does the width.

Figure 5A:
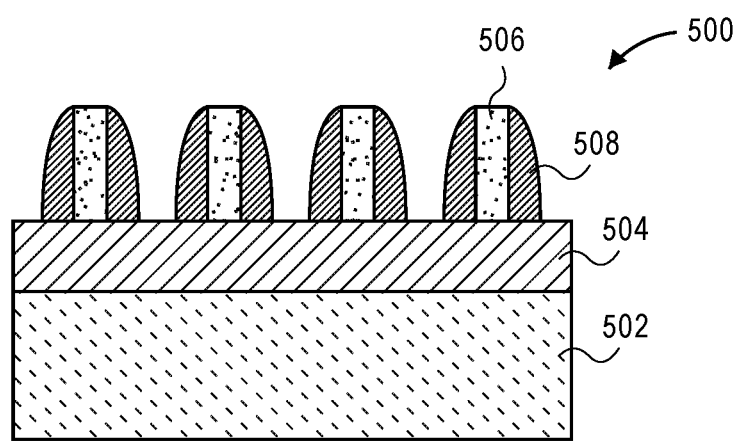
FIG. 5A illustrates a cross-sectional view of a starting structure following deposition, but prior to patterning, of a hardmask material layer formed on an interlayer dielectric (ILD) layer, in accordance with an embodiment of the present disclosure.
Figure 5B:
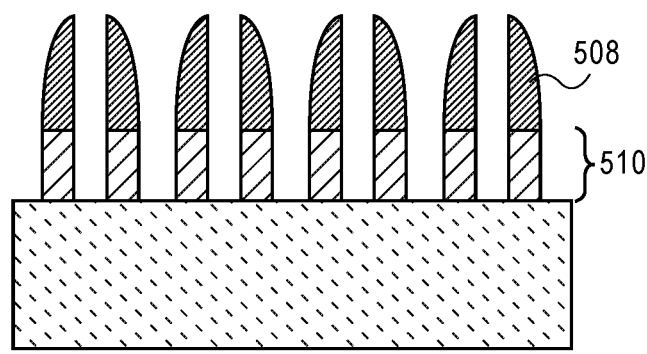
FIG. 5B illustrates a cross-sectional view of the structure of FIG. 4 following patterning of the hardmask layer by pitch halving, in accordance with an embodiment of the present disclosure.

In an embodiment, pitch division techniques are used to increase a line density. In a first example, pitch halving can be implemented to double the line density of a fabricated grating structure. FIG. 5A illustrates a cross-sectional view of a starting structure following deposition, but prior to patterning, of a hardmask material layer formed on an interlayer dielectric (ILD) layer. FIG. 5B illustrates a cross-sectional view of the structure of FIG. 5A following patterning of the hardmask layer by pitch halving.

Referring to FIG. 5A, a starting structure 500 has a hardmask material layer 504 formed on an interlayer dielectric (ILD) layer 502. A patterned mask 506 is disposed above the hardmask material layer 504. The patterned mask 506 has spacers 508 formed along sidewalls of features (lines) thereof, on the hardmask material layer 504.

Referring to FIG. 5B, the hardmask material layer 504 is patterned in a pitch halving approach. Specifically, the patterned mask 506 is first removed. The resulting pattern of the spacers 508 has double the density, or half the pitch or the features of the mask 506. The pattern of the spacers 508 is transferred, e.g., by an etch process, to the hardmask material layer 504 to form a patterned hardmask 510, as is depicted in FIG. 5B. In one such embodiment, the patterned hardmask 510 is formed with a grating pattern having unidirectional lines. The grating pattern of the patterned hardmask 510 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 510 of FIG. 5B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 6:
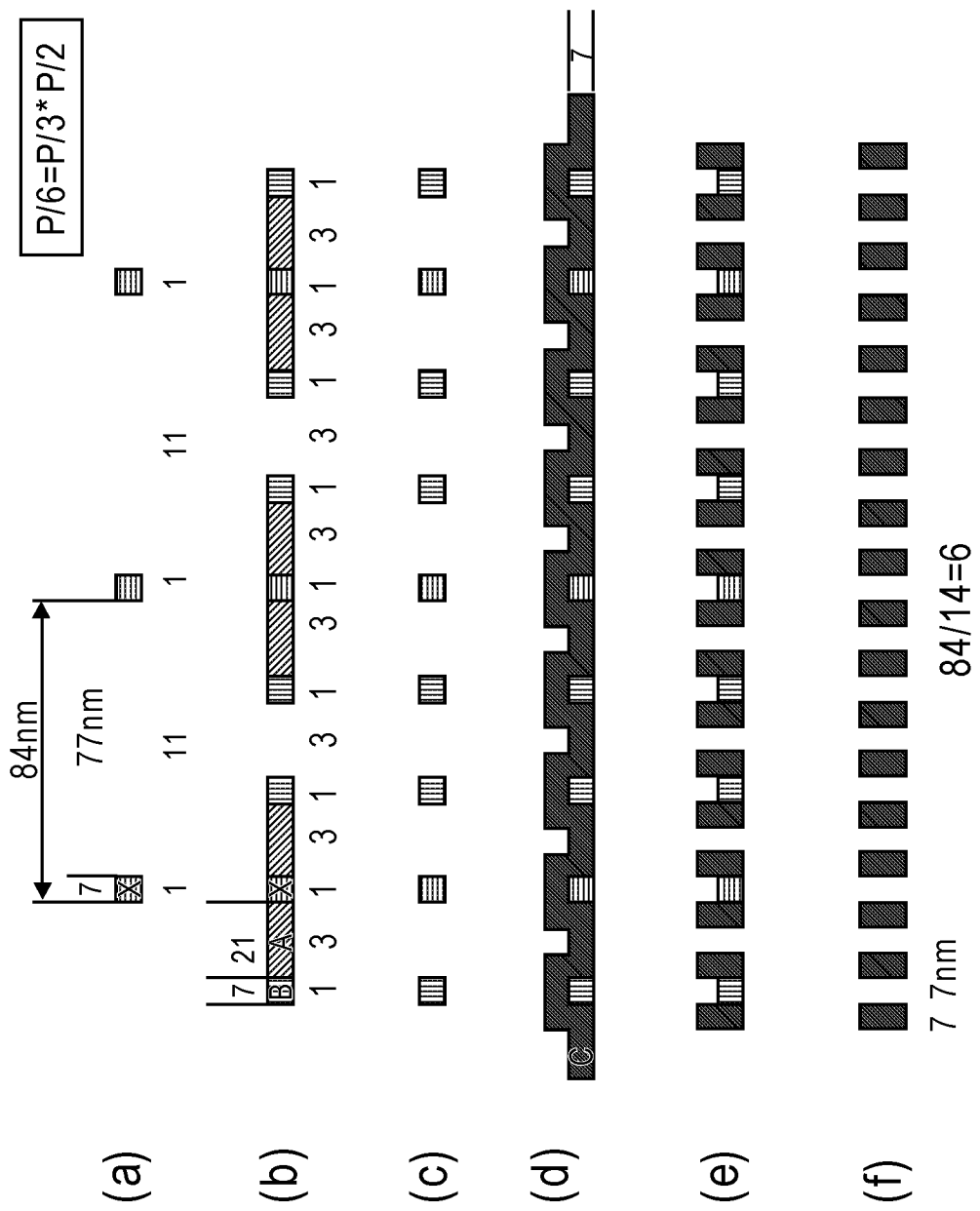
FIG. 6 illustrates cross-sectional views in a spacer-based-sextuple-patterning (SBSP) processing scheme which involves pitch division by a factor of six, in accordance with an embodiment of the present disclosure.

It is to be appreciated that other pitch division approaches may also be implemented. For example, FIG. 6 illustrates cross-sectional views in a spacer-based-sextuple-patterning (SBSP) processing scheme which involves pitch division by a factor of six. Referring to FIG. 6, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

In an embodiment, lithographic operations are performed using 193 nm immersion litho (i 193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Figure 7A:
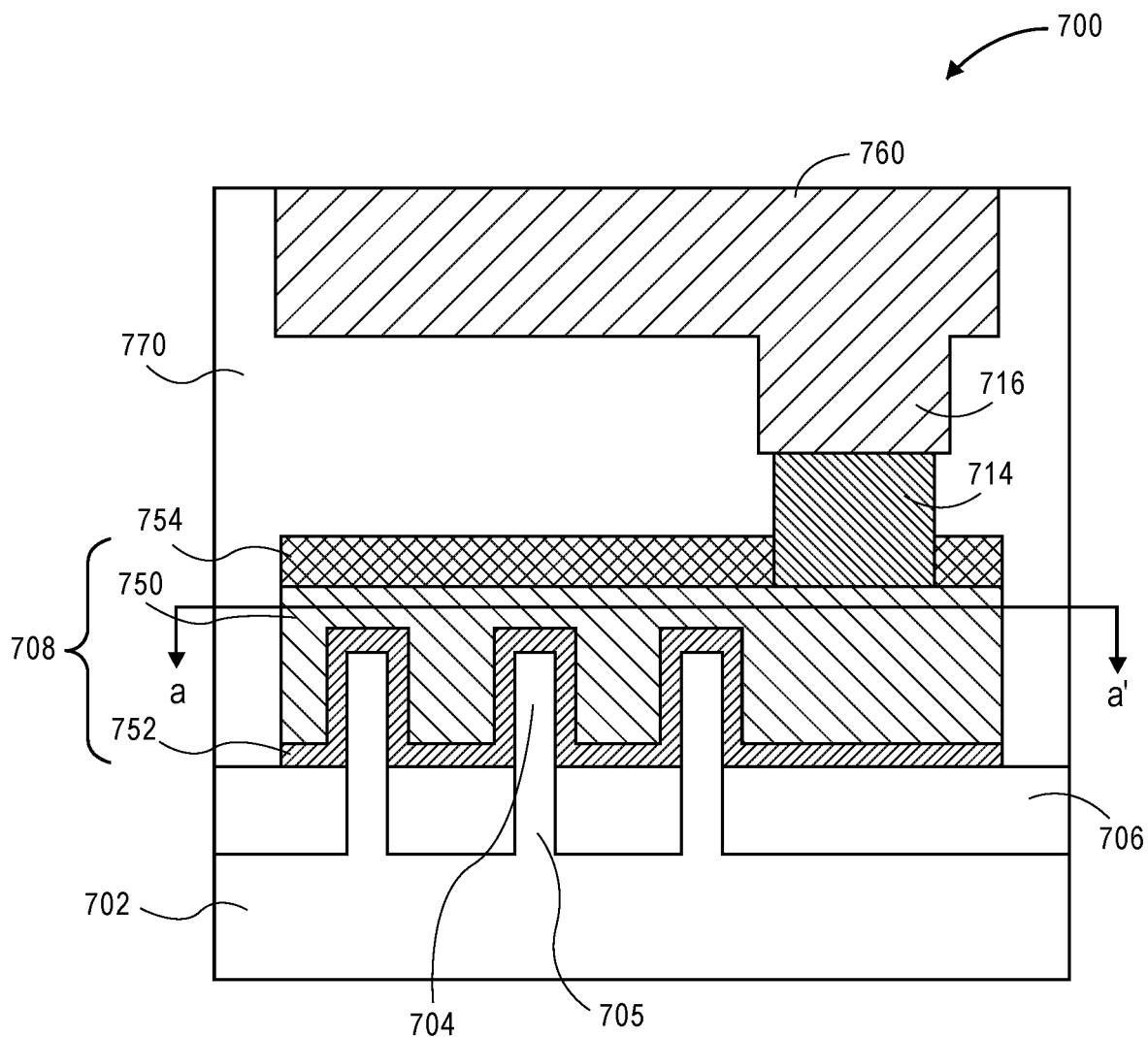
FIG. 7A illustrates a cross-sectional view of a non-planar semiconductor device having a self-aligned gate contact, in accordance with an embodiment of the present disclosure.
Figure 7B:
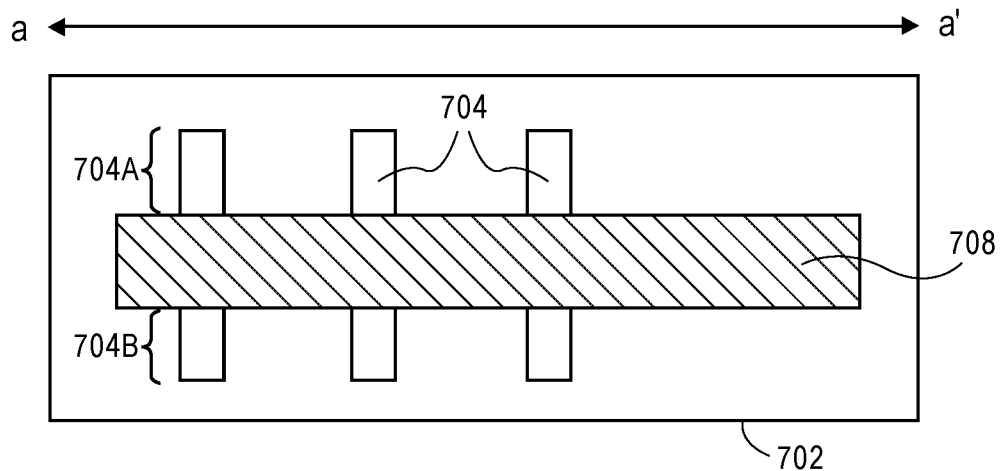
FIG. 7B illustrates a plan view taken along the a-a' axis of the semiconductor device of FIG. 7A, in accordance with an embodiment of the present disclosure.

In another aspect, one or more embodiments described herein are directed to fabricating semiconductor devices, such as for PMOS and NMOS device fabrication. For example, approaches described herein may be implemented to fabricate a self-aligned gate contact used in a metal oxide semiconductor (MOS) device. As an example of a completed device, FIG. 7A illustrates a cross-sectional view of a non-planar semiconductor device having a self-aligned gate contact, in accordance with an embodiment of the present disclosure. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions.

In accordance with an embodiment of the present disclosure, the dielectric cap 754 is similar to dielectric capping layer 314 and is in a recess above a selected gate electrode line. In an embodiment, the selected gate electrode line having the dielectric cap thereon is between adjacent gate lines having a selective hardmask (such as hardmask 318) thereon, enabling self-alignment of the gate contact 714 on the selected gate electrode line depicted. In one such embodiment, the gate contact 714 is formed in an opening (such as opening 325) formed in the dielectric cap layer 754, as is depicted in FIG. 7A.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group m-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

Gate line 708 may be composed of a gate electrode stack which includes a gate dielectric layer 752 and a gate electrode layer 750. In an embodiment, the gate electrode 750 of the gate electrode stack is composed of a metal gate and the gate dielectric layer 752 is composed of a high-K material. For example, in one embodiment, the gate dielectric layer 752 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer 752 is composed of a top portion of hafnium oxide and a bottom portion of silicon dioxide or silicon oxy-nitride.

In an embodiment, the gate electrode layer 750 of gate line 708 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers. In an embodiment, the dielectric cap layer 754 is composed of a material such as described above in association with dielectric capping layer 314, described above.

Spacers associated with the gate electrode stacks (not shown) may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714 and overlying gate contact via 716 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). In accordance with an embodiment of the present disclosure, the gate contact 714 is a self-aligned gate contact.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
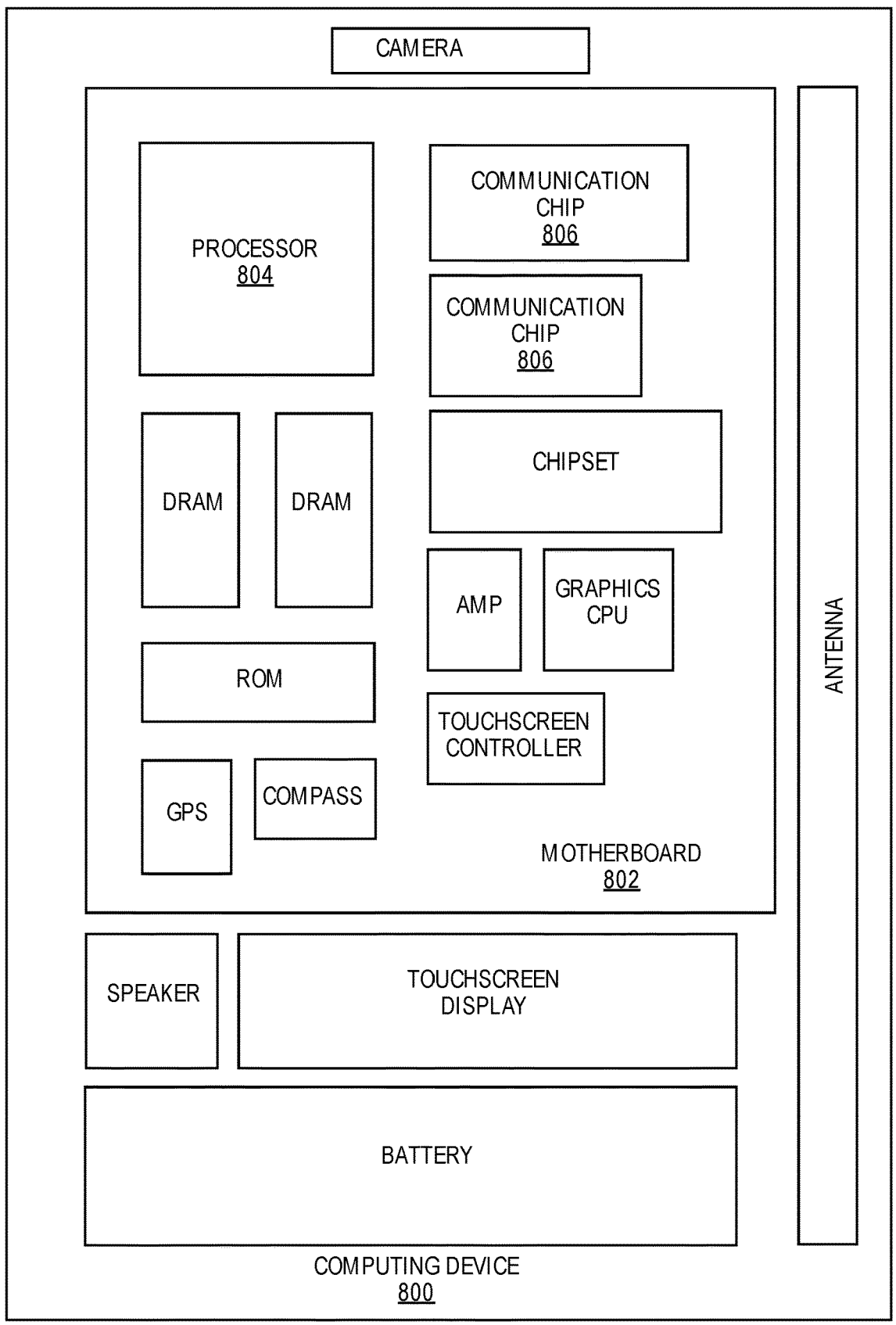
FIG. 8 illustrates a computing device in accordance with one implementation of an embodiment of the present disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more structures, such as selective hardmasks and corresponding conductive vias, built in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the disclosure, the integrated circuit die of the communication chip includes one or more structures, such as selective hardmasks and corresponding conductive vias, built in accordance with implementations of embodiments of the disclosure.

In further implementations, another component housed within the computing device 800 may contain an integrated circuit die that includes one or more structures, such as selective hardmasks and corresponding conductive vias, built in accordance with implementations of embodiments of the disclosure.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
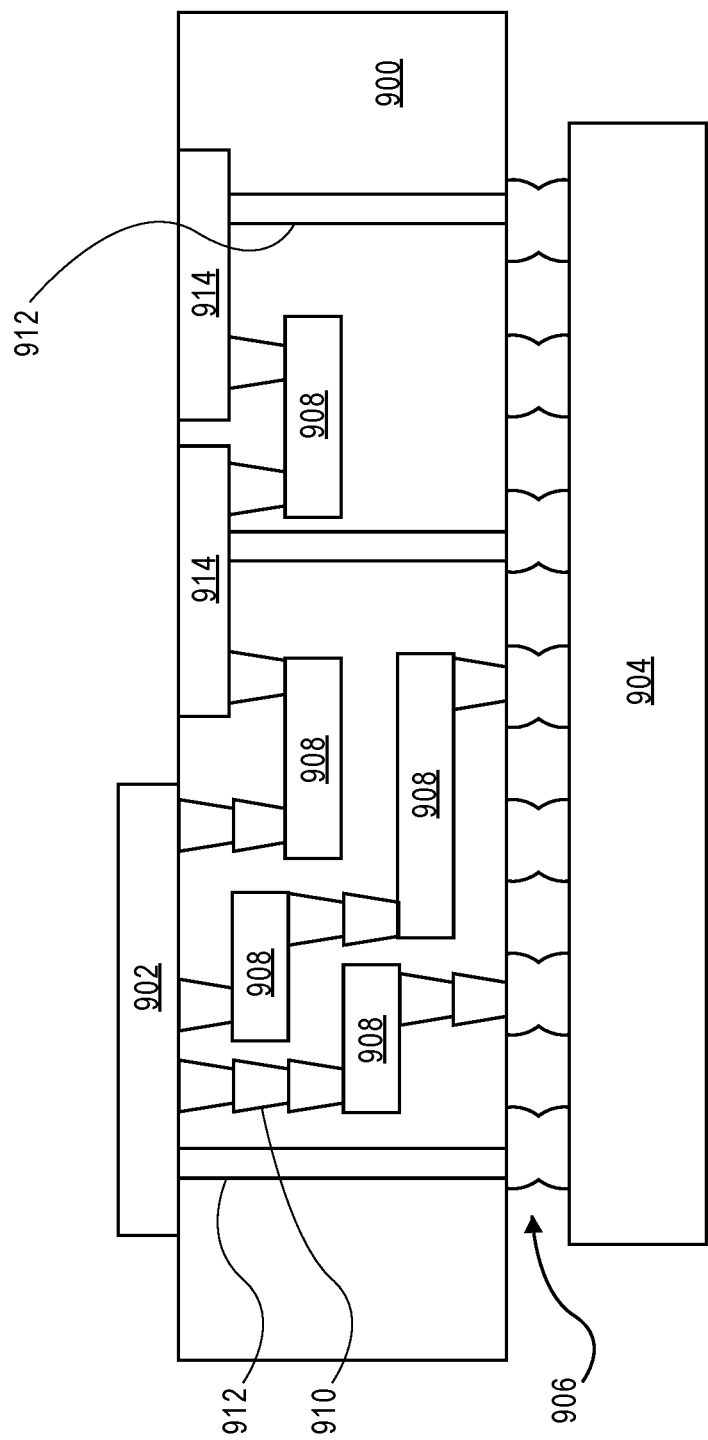
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments of the present disclosure include selective hardmask approaches for conductive via fabrication, and the resulting structures.

Example Embodiment 1

An integrated circuit structure includes a plurality of conductive lines in an inter-layer dielectric (ILD) layer above a substrate. The plurality of conductive lines includes alternating non-recessed conductive lines and recessed conductive lines. The non-recessed conductive lines are substantially co-planar with the ILD layer, and the recessed conductive lines are recessed relative to an uppermost surface of the ILD layer. A dielectric capping layer is in recess regions above the recessed conductive lines. A hardmask layer is over the non-recessed conductive lines but not over the dielectric capping layer of the recessed conductive lines. The hardmask layer differs in composition from the dielectric capping layer. A conductive via is in an opening in the dielectric capping layer and on one of the recessed conductive lines. A portion of the conductive via is on a portion of the hardmask layer.

Example Embodiment 2

The integrated circuit of example embodiment 1, wherein the conductive via is over a portion of the hardmask layer over one of the non-recessed conductive lines adjacent to the one of the recessed conductive lines.

Example Embodiment 3

The integrated circuit of example embodiment 1, wherein the hardmask layer includes an extension portion over a portion of the ILD layer between one of the non-recessed conductive lines and the one of the recessed conductive lines.

Example Embodiment 4

The integrated circuit structure of example embodiment 3, wherein the conductive via is over the extension portion of the hardmask layer over the portion of the ILD layer.

Example Embodiment 5

The integrated circuit structure of example embodiment 4, wherein the conductive via is further over a portion of the hardmask layer over the one of the non-recessed conductive lines.

Example Embodiment 6

The integrated circuit structure of example embodiment 1, 2, 3, 4 or 5, wherein the dielectric capping layer has an uppermost surface substantially co-planar with the uppermost surface of the ILD layer.

Example Embodiment 7

The integrated circuit structure of example embodiment 1, 2, 3, 4, 5 or 6, further including a second ILD layer above the hardmask layer, wherein the conductive via is further in an opening of the second ILD layer.

Example Embodiment 8

The integrated circuit structure of example embodiment 7, wherein the opening of the second ILD layer has a width greater than a width of the opening in the dielectric capping layer.

Example Embodiment 9

The integrated circuit structure of example embodiment 1, 2, 3, 4, 5, 6, 7 or 8, wherein one of the plurality of conductive lines is coupled to an underlying conductive via structure, the underlying conductive via structure connected to an underlying metallization layer of the integrated circuit structure.

Example Embodiment 10

The integrated circuit structure of example embodiment 1, 2, 3, 4, 5, 6, 7, 8 or 9, wherein the hardmask layer includes aluminum oxide, and the dielectric capping layer includes a material selected from the group consisting of silicon oxide, carbon-doped silicon, silicon nitride, boron carbide, boron nitride, and silicon oxynitride.

Example Embodiment 11

The integrated circuit structure of example embodiment 1, 2, 3, 4, 5, 6, 7, 8, 9 or 10, wherein a total composition of the non-recessed conductive lines is different than a total composition of the recessed conductive lines.

Example Embodiment 12

An integrated circuit structure includes a plurality of conductive lines in an inter-layer dielectric (ILD) layer above a substrate. A hardmask layer is only over alternating ones of the plurality of conductive lines, the hardmask layer having openings over remaining ones of the plurality of conductive lines. A conductive via is in one of the openings over one of the remaining ones of the plurality of conductive lines. A portion of the conductive via is on a portion of the hardmask layer over one of the alternating ones of the plurality of conductive lines adjacent to the one of the remaining ones of the plurality of conductive lines.

Example Embodiment 13

The integrated circuit structure of example embodiment 12, wherein the hardmask layer includes an extension portion over a portion of the ILD layer between the one of the alternating ones of the plurality of conductive lines and the one of the remaining ones of the plurality of conductive lines. The conductive via is over the extension portion of the hardmask layer over the portion of the ILD layer.

Example Embodiment 14

The integrated circuit structure of example embodiment 12 or 13, further including a second ILD layer above the hardmask layer. The conductive via is further in an opening of the second ILD layer.

Example Embodiment 15

The integrated circuit structure of example embodiment 12, 13 or 14, wherein one of the plurality of conductive lines is coupled to an underlying conductive via structure, the underlying conductive via structure connected to an underlying metallization layer of the integrated circuit structure.

Example Embodiment 16

A method of fabricating a back end of line (BEOL) metallization layer includes forming a plurality of conductive lines in an inter-layer dielectric (ILD) layer above a substrate. The method also includes recessing alternating ones of the plurality of conductive lines relative to an uppermost surface of the ILD layer. The method also includes forming a dielectric capping layer on the alternating ones of the plurality of conductive lines, in recess regions above each of the alternating ones of the plurality of conductive lines. The method also includes forming a hardmask layer over non-recessed ones of the plurality of conductive lines but not over the dielectric capping layer, the hardmask layer differing in composition from the dielectric capping layer. The method also includes forming an opening in the dielectric capping layer over one of the alternating ones of the plurality of conductive lines. The method also includes forming a conductive via in the opening in the dielectric capping layer and on a portion of the hardmask layer over one of the non-recessed ones of the plurality of conductive lines.

Example Embodiment 17

The method of example embodiment 16, wherein forming the hardmask layer includes forming a brush layer over the non-recessed ones of the plurality of conductive lines but not over the dielectric capping layer, filling pores or spacings of the brush layer with hardmask material or hardmask precursors, and removing substantially all of the brush layer, where the hardmask layer is formed from the hardmask material or hardmask precursors during or subsequent to removing substantially all of the brush layer.

Example Embodiment 18

The method of example embodiment 17, wherein removing substantially all of the brush layer includes ashing a molecular layer of the brush layer.

Example Embodiment 19

The method of example embodiment 16, 17 or 18, wherein the hardmask layer and the dielectric capping layer differ in etch selectivity.

Example Embodiment 20

The method of example embodiment 16, 17, 18 or 19, wherein forming the plurality of conductive lines includes using a pitch division patterning process.

What is claimed is:
1. An integrated circuit structure, comprising:
a plurality of conductive lines in an inter-layer dielectric (ILD) layer above a substrate, wherein the plurality of conductive lines includes alternating non-recessed conductive lines and recessed conductive lines, the non-recessed conductive lines substantially co-planar with the ILD layer, and the recessed conductive lines recessed relative to an uppermost surface of the ILD layer;

a dielectric capping layer in recess regions above the recessed conductive lines;

a hardmask layer over the non-recessed conductive lines but not over the dielectric capping layer of the recessed conductive lines, the hardmask layer differing in composition from the dielectric capping layer; and a conductive via in an opening in the dielectric capping layer and on one of the recessed conductive lines, wherein a portion of the conductive via is on a portion of the hardmask layer.

2. The integrated circuit of claim 1, wherein the conductive via is over a portion of the hardmask layer over one of the non-recessed conductive lines adjacent to the one of the recessed conductive lines.

3. The integrated circuit structure of claim 1, wherein the hardmask layer includes an extension portion over a portion of the ILD layer between one of the non-recessed conductive lines and the one of the recessed conductive lines.

4. The integrated circuit structure of claim 3, wherein the conductive via is over the extension portion of the hardmask layer over the portion of the ILD layer.

5. The integrated circuit structure of claim 4, wherein the conductive via is further over a portion of the hardmask layer over the one of the non-recessed conductive lines.

6. The integrated circuit structure of claim 1, wherein the dielectric capping layer has an uppermost surface substantially co-planar with the uppermost surface of the ILD layer.

7. The integrated circuit structure of claim 1, further comprising:
a second ILD layer above the hardmask layer, wherein the conductive via is further in an opening of the second ILD layer.

8. The integrated circuit structure of claim 7, wherein the opening of the second ILD layer has a width greater than a width of the opening in the dielectric capping layer.

9. The integrated circuit structure of claim 1, wherein one of the plurality of conductive lines is coupled to an underlying conductive via structure, the underlying conductive via structure connected to an underlying metallization layer of the integrated circuit structure.

10. The integrated circuit structure of claim 1, wherein the hardmask layer comprises aluminum oxide, and the dielectric capping layer comprises a material selected from the group consisting of silicon oxide, carbon-doped silicon, silicon nitride, boron carbide, boron nitride, and silicon oxynitride.

11. The integrated circuit structure of claim 1, wherein a total composition of the non-recessed conductive lines is different than a total composition of the recessed conductive lines.

12. An integrated circuit structure, comprising:
a plurality of conductive lines in an inter-layer dielectric (ILD) layer above a substrate;
a hardmask layer only over alternating ones of the plurality of conductive lines, the hardmask layer having openings over remaining ones of the plurality of conductive lines; and
a conductive via in one of the openings over one of the remaining ones of the plurality of conductive lines, wherein a portion of the conductive via is on a portion of the hardmask layer over one of the alternating ones of the plurality of conductive lines adjacent to the one of the remaining ones of the plurality of conductive lines.

13. The integrated circuit structure of claim 12, wherein the hardmask layer includes an extension portion over a portion of the ILD layer between the one of the alternating ones of the plurality of conductive lines and the one of the remaining ones of the plurality of conductive lines, and wherein the conductive via is over the extension portion of the hardmask layer over the portion of the ILD layer.

14. The integrated circuit structure of claim 12, further comprising:
a second ILD layer above the hardmask layer, wherein the conductive via is further in an opening of the second ILD layer.

15. The integrated circuit structure of claim 12, wherein one of the plurality of conductive lines is coupled to an underlying conductive via structure, the underlying conductive via structure connected to an underlying metallization layer of the integrated circuit structure.

16. A method of fabricating a back end of line (BEOL) metallization layer, the method comprising:
forming a plurality of conductive lines in an inter-layer dielectric (ILD) layer above a substrate;
recessing alternating ones of the plurality of conductive lines relative to an uppermost surface of the ILD layer;
forming a dielectric capping layer on the alternating ones of the plurality of conductive lines, in recess regions above each of the alternating ones of the plurality of conductive lines;
forming a hardmask layer over non-recessed ones of the plurality of conductive lines but not over the dielectric capping layer, the hardmask layer differing in composition from the dielectric capping layer;
forming an opening in the dielectric capping layer over one of the alternating ones of the plurality of conductive lines; and
forming a conductive via in the opening in the dielectric capping layer and on a portion of the hardmask layer over one of the non-recessed ones of the plurality of conductive lines.

17. The method of claim 16, wherein forming the hardmask layer comprises:
forming a brush layer over the non-recessed ones of the plurality of conductive lines but not over the dielectric capping layer;
filling pores or spacings of the brush layer with hardmask material or hardmask precursors; and
removing substantially all of the brush layer, wherein the hardmask layer is formed from the hardmask material or hardmask precursors during or subsequent to removing substantially all of the brush layer.

18. The method of claim 17, wherein removing substantially all of the brush layer comprises ashing a molecular layer of the brush layer.

19. The method of claim 16, wherein the hardmask layer and the dielectric capping layer differ in etch selectivity.

20. The method of claim 16, wherein forming the plurality of conductive lines comprises using a pitch division patterning process.

* * * * *